United States Patent [19]

Truong et al.

[11] Patent Number: 5,636,226

[45] Date of Patent: Jun. 3, 1997

[54] FAULT SENSING CIRCUIT AND METHOD

[75] Inventors: Phat C. Truong; John F. Schreck, both of Houston, Tex.

[73] Assignee: Texas Instruments Incorporated, Dallas, Tex.

[21] Appl. No.: 369,978

[22] Filed: Jan. 9, 1995

Related U.S. Application Data

[63] Continuation of Ser. No. 58,817, May 10, 1993, abandoned, which is a continuation of Ser. No. 450,775, Dec. 14, 1989, abandoned.

[51] Int. Cl.$^6$ ...................................................... G06F 11/00
[52] U.S. Cl. ............................................. 371/22.1; 371/64
[58] Field of Search ........................... 371/64, 29.1, 57.1, 371/66, 21.1, 22.1; 324/543, 522, 523; 307/443, 350; 340/660, 662, 663; 365/205

[56] References Cited

U.S. PATENT DOCUMENTS

| | | | |
|---|---|---|---|
| 3,922,610 | 11/1975 | Buchan et al. | 307/516 |
| 4,027,262 | 5/1977 | Sharpe | 307/247.1 |
| 4,187,525 | 2/1980 | Nagura et al. | 364/482 X |
| 4,277,676 | 7/1981 | Kammerer | 377/15 |
| 4,308,581 | 12/1981 | Raghunathan | 371/29.1 |
| 4,336,495 | 6/1982 | Hapke | 324/158 R |
| 4,398,146 | 8/1983 | Draheim et al. | 324/158 T |
| 4,680,664 | 7/1987 | Leuthen | 361/101 |
| 4,733,168 | 3/1988 | Blankenship et al. | 324/158 R |
| 4,841,233 | 6/1989 | Yoshida | 371/21.4 |
| 4,956,842 | 9/1990 | Said | 371/62 |
| 5,077,738 | 12/1991 | Larsen et al. | 371/15.1 |

OTHER PUBLICATIONS

Bottorff et al., Test Generation for Large Logic Networks, Proc., 14th Design Automation Conference, Jun. 1977.
Ercegovac et al., Digital Systems and Hardware/Firmware Algorithm, 1985, pp. 765–768.

*Primary Examiner*—Robert W. Beausoliel, Jr.
*Assistant Examiner*—Ly V. Hua
*Attorney, Agent, or Firm*—Theodore D. Lindgren; Leo N. Heiting; Richard L. Donaldson

[57] ABSTRACT

A fault sensing circuit for detecting the state of at least one latch controlled by at least one control signal is provided. The circuit comprises an additional latch also controlled by the same control signal and receiving an input of a known value. The output of the additional latch is coupled to an I/O pin where an external circuit may monitor its logic state to determine the occurrence of a fault.

15 Claims, 2 Drawing Sheets

FAULT SENSING CIRCUIT AND METHOD

This application is a continuation of application Ser. No. 08/058,817, filed May 10, 1993, abandoned, which is a continuation of application Ser. No. 07/450,775 filed Dec. 14, 1989, abandoned.

TECHNICAL FIELD OF THE INVENTION

This invention relates to semiconductor devices, and more particularly to a fault sensing circuit and method.

BACKGROUND OF THE INVENTION

The use of semiconductor integrated circuit devices has expanded to applications where the operating environment is hostile, such as the automotive and industrial applications. Electromagnetic noise spikes which are ever present in these environments may cause these devices to malfunction. Additionally, noisy power supplies may disrupt device operations. For a circuit to function properly in these applications, the designers of the integrated circuit devices have to contend with the presence of electromagnetic noises and their undesirable interference with device operations.

The designers have attempted to noise-proof the devices on several fronts. New semiconductor technologies have been developed which are less susceptible to noise, and innovative packaging which shields the electronics from the noisy environment have been developed. It has also become desireable to detect a fault when it occurs in an integrated circuit device so that remedial steps may be taken to correct the situation.

Integrated circuit devices may have a number of latches which store input values present at the input pins. These input latches may be sensitive to noise and may be reset incorrectly in its presence. As a result, the input values needed to perform circuit functions may become lost, causing the device to perform incorrectly and/or to produce incorrect output values.

In a particular device application, latches are used to latch in values associated with identifying specific test modes for testing and exercising the device. If the control signals enabling and resetting the latches are sensitive to noise in the operating environment, the test mode values are lost, resulting in the device not being properly tested. In order for the device manufacturer to ensure device quality, such faults occurring during the test procedure must be detected so that the device may be retested.

Accordingly, a need has arisen for a circuit and method which detects faults associated with input latches in an integrated circuit device, so that corrective steps may be taken. The circuit should also advantageously improve the testability of an integrated circuit device.

SUMMARY OF THE INVENTION

In accordance with the present invention, a fault sensing circuit and method is provided which substantially eliminates or reduces disadvantages and problems associated with semiconductor devices in noisy environments.

In an aspect of the present invention, a fault sensing circuit for detecting a fault in at least one input latch enabled by a control signal is provided. The circuit comprises a fault detection latch and a control input of the fault detection latch for receiving the control signal. In addition, a source of a predetermined voltage level is received by a data input of the fault detection latch. The fault detection latch produces an output signal in response to the predetermined voltage level and the control signal.

An important technical advantage of the present invention is that it provides a circuit and method for detecting when the input latches are incorrectly reset by outside sources. Another technical advantage is that the present invention provides for fault sensing so that remedial steps may be taken to correct the situation. Yet another technical advantage of the present invention includes improving the testability of an integrated circuit device.

BRIEF DESCRIPTION OF THE DRAWINGS

For a better understanding of the present invention, reference may be made to the accompanying drawing, in which.

DETAILED DESCRIPTION OF THE INVENTION

Figure 1:
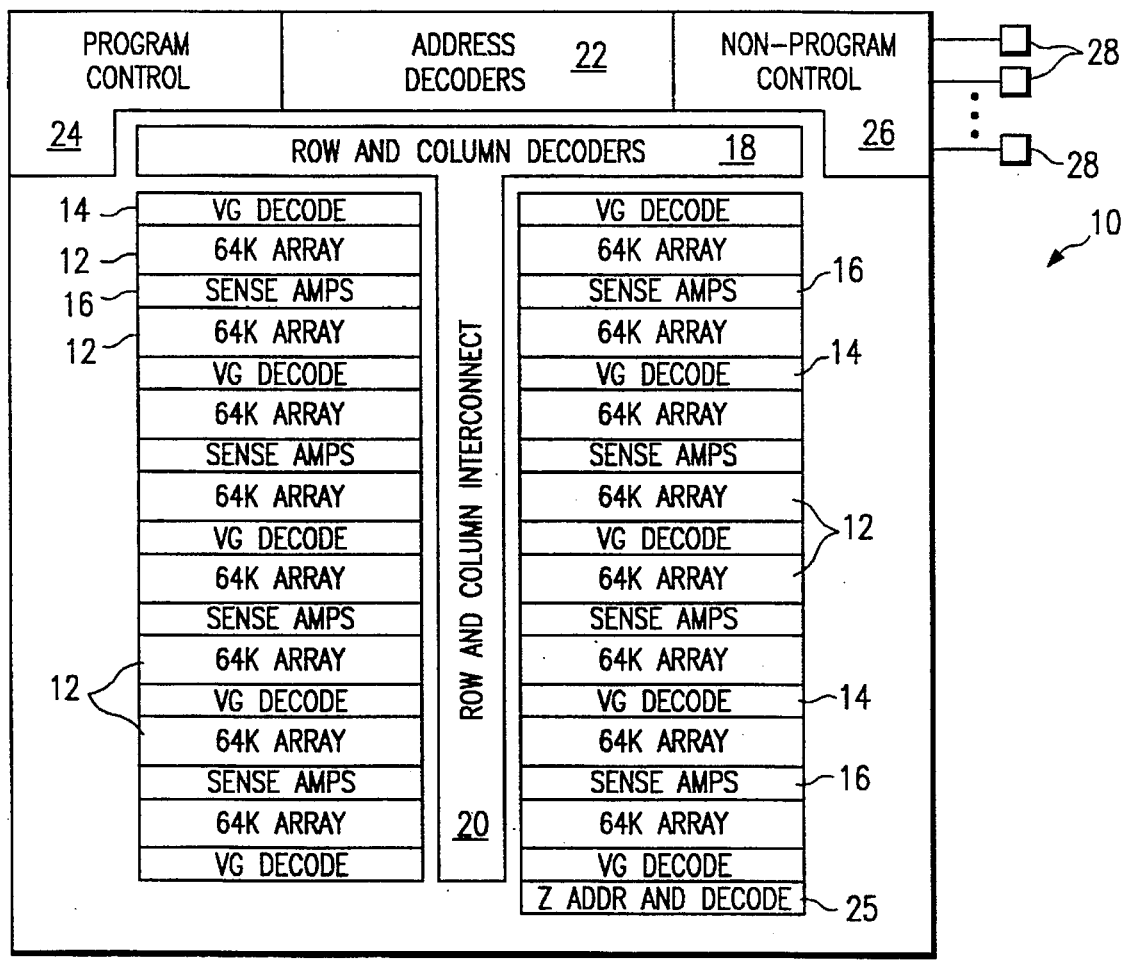
FIG. 1 is a high level schematic block diagram of a one-megabyte electrically programmable read only memory showing an approximate geographical location of cell arrays and circuit blocks on a chip.

FIG. 1 is a high level schematic block diagram showing central portions of a chip on which a one-megabyte complementary metal oxide semiconductor, electrically programmable read only memory array is fabricated. This one-megabyte array is indicated generally by 10. Array 10 is organized into sixteen 64K array sections 12. Located between pairs of array sections 12 are virtual ground decoder section 14 and sense amplifier sections 16. Each sense amplifier section 16 contains 32 sense amplifiers, sixteen of which are associated with each adjacent array section 12.

In the illustrated embodiment, the array sections 12, together with their corresponding virtual ground decoder sections 14 and sense amplifier sections 16, are organized in a higher-order array of two columns and eight rows. A row and column decoder section 18 is situated at the top of this higher-order array, and is connected to the respective array sections 12, virtual ground decoder sections 14 and sense amplifier sections 16 through a row and column interconnect section 20. An address decoder section 22 has outputs that connect to the adjacent row and column decoder section 18. A program control block 24 is situated in the illustrated embodiment in the upper left corner of the chip, and a non-program control block 26 is situated in the upper right corner of the chip. In the illustrated embodiment, a Z address and decoder section 25 is spatially separated from address decoder section 22 and is located in the lower right hand corner of the die 10. A plurality of I/O (input/output) pads 28 are coupled to non-program control block 26 for off-chip communications.

Figure 2:
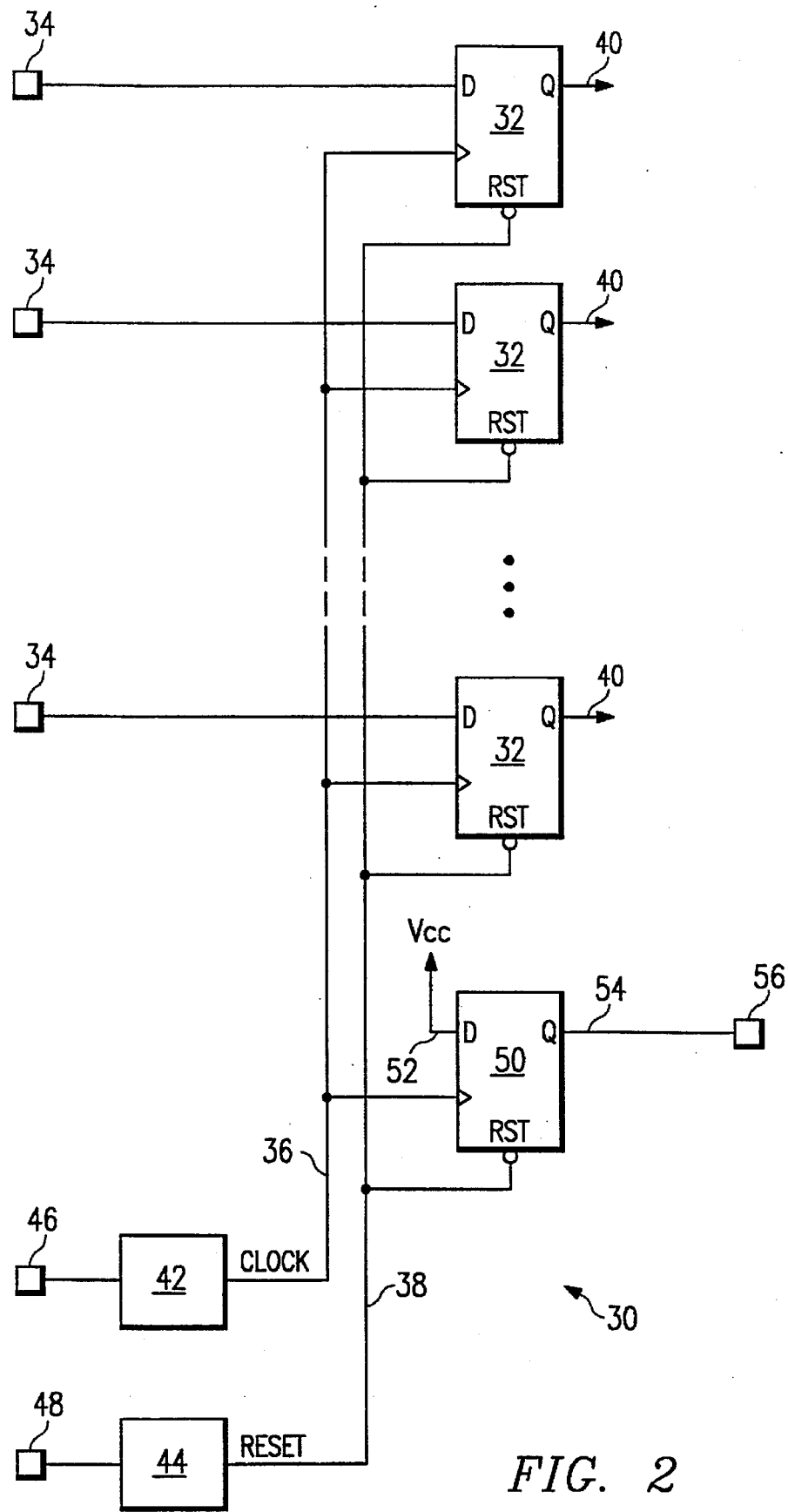
FIG. 2 is a circuit schematic of an embodiment of the present invention.

Referring to FIG. 2, a circuit embodiment of the present invention, indicated generally by 30, is shown. A plurality of input latches 32 are arranged to receive data from respective input/output (I/O) pads 34 of an integrated circuit device (not shown). The I/O pads 34 are coupled to I/O pins to receive signals from circuits which are external to the integrated circuit package. In particular, in the instant application of the fault sensing circuit 30, the data from the I/O pads 34, once decoded, identify a particular test for testing the device. The input latches 32 are clocked by a CLOCK signal input on a line 36 and reset by a RESET signal input on a line 38.

In the instant embodiment of the present invention, input latches 32 are implemented with edge sensitive data flip-flops. In an alternative embodiment, input latches 32 may be implemented with level sensitive latches. Accordingly, input latches 32 latch in data values present at the I/O pads 34 at the falling edge of the CLOCK signal. Input latches 32 are further controlled by the RESET signal. Whenever the RESET signal is at a "low" logic level, the input latches 32 are reset, forcing their data outputs 40 to a "low" logic level regardless of the input level. The operations of an edge sensitive flip-flop is well known in the art of digital logic circuits, and will not be discussed in detail herein.

The input latch control signals CLOCK and RESET are generated by high voltage detectors 42 and 44, respectively. The internal structure of high voltage detectors which can be used to detect a non-system operating voltage level and convert the non-system operating voltage into a system operating voltage is well known in the art of digital logic circuits, and will not be discussed in detail herein. The high voltage detectors 42 and 44 detect whenever a non-system operating voltage level, such as the system operating voltage level Vcc plus three volts, is being applied to I/O pads 46 and 48, respectively. The presence of a non-system operating voltage at I/O pads 46 and 48 indicates that the device is going into a test mode. The high voltage detectors 42 and 44 convert the non-system operating "high" voltage level from the I/O pads 46 and 48 into a system operating voltage level, which then serve as the CLOCK and RESET signals for input latches 32.

An independent fault detection data latch 50 is constructed to be similar to input latches 32. Data latch 50 is connected to receive the same CLOCK and RESET control signals as input latches 32. Rather than receiving an input from an I/O pad, an input 52 of data latch 50 is connected to a known voltage level. Since there is concern for the possibility that input latches 32 may be reset incorrectly or prematurely, the suitable input to the data latch 50 is a logic "high" voltage level, or $V_{cc}$. In instances where the RESET signal is corrupted, causing the latches 32 and 50 to reset incorrectly, an output 54 of the data latch 50, which is connected to an output pad 56, becomes "low." The I/O pad 56 is coupled to an I/O pin, where an external circuit (not shown) may readily detect its logic level, and take remedial steps to retest the device if necessary. It is important to note that the logic level of the known input to the fault detection latch should be the inverse of the logic state of the output of the input latches when the control signal in questions is active.

The operation of the fault sensing circuit 30 is best described in relation to its use in integrated circuit devices operating in noisy environments and/or with noisy power supplies. In devices where inputs are latched into the device by input latches 32, the signals controlling input latches 32 may be sensitive to noise, resulting in disrupted latch operations. Input latches 32 may be reset, set, enabled, or disabled unintentionally, thus corrupting the data in input latches 32 or altering the states thereof.

In a particular application of the present invention, input latches 32 serve to latch in an encoded test specification, so that once decoded, the test specification will indicate a particular test to be performed on the device. The testing is controlled by an external circuit (not shown). To initialize testing, non-system operating voltages are placed on I/O pads 46 and 48, which are detected by high voltage detectors 42 and 44. The high voltage detectors 42 and 44 respectively output the CLOCK and RESET signals for controlling input latches 32 and data latch 50. At the active edge of the CLOCK signal, data which have been placed on I/O pads 34 are latched in by input latches 32, which are then provided as inputs to decoders (not shown) that determine which particular test is being specified.

At the same time, fault detection latch 50 is also enabled by the active CLOCK signal and the "high" $V_{cc}$ logic level is latched in and provided as an output on I/O pad 56. The external test circuit monitors the logic level at I/O pad 56. If the logic level at I/O pad 56 is "low" during testing, then fault detection latch 50 has been reset by a corrupted RESET signal, which indicates that input latches 32 have also been reset prematurely. The external circuit now may reinitialize the device to reenter testing or perform alternative remedial steps.

The external circuit may detect the device falling out of the test mode by monitoring the logic level on I/O pad 56, which may be coupled to a no-connect I/O pin on the device. Alternatively, one or several I/O pins on the device may display a certain logic pattern generated by a circuit (not shown) which is activated by the output 54 of fault detection latch 50. In other embodiments, the fact that the device is disrupted by noise, as detectable by fault detection latch 50 being reset erroneously, is conveyed to the external circuit in any of several known fashions so that remedial steps may be taken. In a preferred embodiment, I/O pads 34 of FIG. 2 correspond to I/O pads 28 of FIG. 1. In such an embodiment, the plurality of I/O pads 34 are coupled through a plurality of input latches 32 to non-program control block 26 for off-chip communications.

In view of the foregoing, it can be appreciated that the fault sensing circuit of the present invention detects whether external input data have been properly latched into an integrated circuit device. In a particular application, the external input data provides encoded test specifications which are essential to test the device. In order to measure the quality of the device, it is imperative that the device test be completely performed and that the device pass the test. The fault sensing circuit 30 ensures that if a test is disrupted by noise in the operating environment, it is detected so that remedial steps are taken.

Although the present invention has been described in detail, it should be understood that various changes, substitutions and alterations can be made hereto without departing from the spirit and scope of the invention as defined by the appended claims.

What is claimed is:

1. A fault sensing circuit coupled to at least first, second and third I/O pads of an integrated circuit, said fault sensing circuit for providing external indication at said first I/O pad of the state of a plurality of input latches controlled by at least a RESET signal, comprising:

a fault detection latch for receiving said RESET signal and receiving a high input signal, said fault detection latch producing an output signal at said first I/O pad in response to said RESET signal and said high input signal, said output signal indicative in one state of premature resetting of said input latch; and first and second high voltage detectors coupled to said second and third I/O pads, said high voltage detectors for receiving non-system operating voltages and for supplying said RESET signal to said input latches and to said fault detection latch, respectively.

2. The circuit, as set forth in claim 1, wherein the receipt by said fault detection latch of a corrupted RESET signal causes said fault detection latch to generate a low output signal at said first I/O pad.

3. A fault sensing circuit providing, at a pad of an integrated circuit, external indication of the state of a plurality of input latches controlled by at least a RESET signal; said fault sensing circuit comprising:

at least one input latch having a data input coupled to a first I/O pad, said input latch enabled by control signals;

a fault detection latch enabled by said control signals and having a data input connected to a constant voltage source and a data output connected to a second I/O pad, said data output providing said external indication in one state of premature resetting of said input latch; and at least one high voltage detector coupling a said control signal to said at least one input latch and to said fault detection latch in response to a high voltage signal received at a third I/O pad coupled to inputs of said at least one high voltage detector.

4. The fault sensing circuit of claim 3 in which said fault detection latch produces an output signal on said data output in response to the control signals and indicative of the state of said at least one input latch.

5. The fault sensing circuit of claim 3 in which said constant voltage source is a high logic level.

6. The fault sensing circuit of claim 3 in which said control signals include CLOCK and RESET signals.

7. The fault sensing circuit of claim 6 in which an output signal on the data output of said fault detection latch has a low logic value in response to said RESET signal being active.

8. The fault sensing circuit of claim 7 in which said low output signal is indicative of said input latch also having a low output signal.

9. The fault sensing circuit of claim 6 in which an output signal on the data output of said fault detection latch has a high logic value in response to said RESET signal being inactive.

10. The fault sensing circuit of claim 3 in which said at least one input latch and said fault detection latch are edge-sensitive flip-flops.

11. The fault sensing circuit of claim 3 in which said at least one high voltage detector receives a non-system operating voltage from said third I/O pad and supplies a RESET signal to said latches.

12. A method for providing, at a pad of an integrated circuit, external indication of the faults associated with input latches in said integrated circuit, said method comprising the steps of:

forming at least one input latch receiving input from a first I/O pad and a fault detection latch receiving input from a constant voltage source;

providing high voltage detectors for coupling control signal inputs of said at least one input and said fault detection latch to I/O pads;

delivering an output of said fault detection latch to a second I/O pad, said external indication in one state of premature resetting of said one input latch; and monitoring the state of the second I/O pad, so that a fault produced by a variation in the control signal may be detected.

13. The method of claim 12 in which said constant voltage source is Vcc.

14. The method of claim 12 in which control signals are provided to said at least one input latch and to said fault detection latch.

15. The method of claim 14 in which said control signals include a CLOCK and a RESET signal.

* * * * *